(12) United States Patent
Strake

(10) Patent No.: US 6,370,292 B1
(45) Date of Patent: Apr. 9, 2002

(54) PRINTED CIRCUIT BOARD AND METHOD FOR ITS MANUFACTURE

(75) Inventor: Engelbert Strake, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/382,258

(22) Filed: Aug. 24, 1999

(30) Foreign Application Priority Data

Aug. 25, 1998 (DE) .......................................... 198 38 519

(51) Int. Cl.⁷ ................................................. G02B 6/12
(52) U.S. Cl. ........................................... 385/14; 385/31
(58) Field of Search ..................... 385/14, 15, 31–33, 385/36, 47–49, 51, 52, 88–94, 39

(56) References Cited

U.S. PATENT DOCUMENTS

| | | | | |
|---|---|---|---|---|
| 4,169,001 A | * | 9/1979 | Kaiser ......................... 156/89 |
| 5,170,448 A | * | 12/1992 | Ackley et al. ................. 385/31 |
| 5,757,989 A | * | 5/1998 | Yoshimura et al. ........... 385/14 |
| 5,761,350 A | * | 6/1998 | Koh ............................. 385/14 |
| 5,786,925 A | * | 7/1998 | Goossen et al. ............. 359/245 |
| 5,898,803 A | * | 4/1999 | Mueller-Fiedler et al. .... 385/36 |
| 5,910,706 A | * | 6/1999 | Stevens et al. ............. 313/498 |
| 6,081,632 A | * | 6/2000 | Yoshimura et al. ............ 385/5 |
| 6,285,808 B1 | * | 9/2001 | Mehlhorn et al. ............ 385/14 |

FOREIGN PATENT DOCUMENTS

| | | |
|---|---|---|
| EP | 0 272 027 | 6/1988 |
| EP | 0 272 027 A2 * | 6/1988 |
| EP | 0 480 618 | 4/1992 |

OTHER PUBLICATIONS

J.E. Thomsen, et al., "Optical Waveguide Circuit Board With A Surface–Mounted Optical Receiver Array", Optical Engineering, vol. 33, No. 3, 989, (1994), (Mar. '94).

* cited by examiner

Primary Examiner—Akm E. Ullah
Assistant Examiner—Michelle R. Connelly-Cushwa
(74) Attorney, Agent, or Firm—Kenyon & Kenyon

(57) ABSTRACT

An optoelectronic, multilayer printed circuit board having at least one layer to be fitted with components. The printed circuit board having an electrical printed circuit trace on the exterior of the layer structure and optical signal-transmission paths which are patterned as integrated multimode waveguides in a system having additional, optically transparent layers. According to this structure, a cost-effective implementation is achieved with respect to optical multimode interconnect lines with passive structures, coupling points for optical fibers and for optoelectronic components for transmitting and receiving optical signals, and conventional electrical signaling links on a shared carrier. The transparent layers are located in the interior of the layer structure, and largely conventional methods are used to pattern these layers.

5 Claims, 2 Drawing Sheets

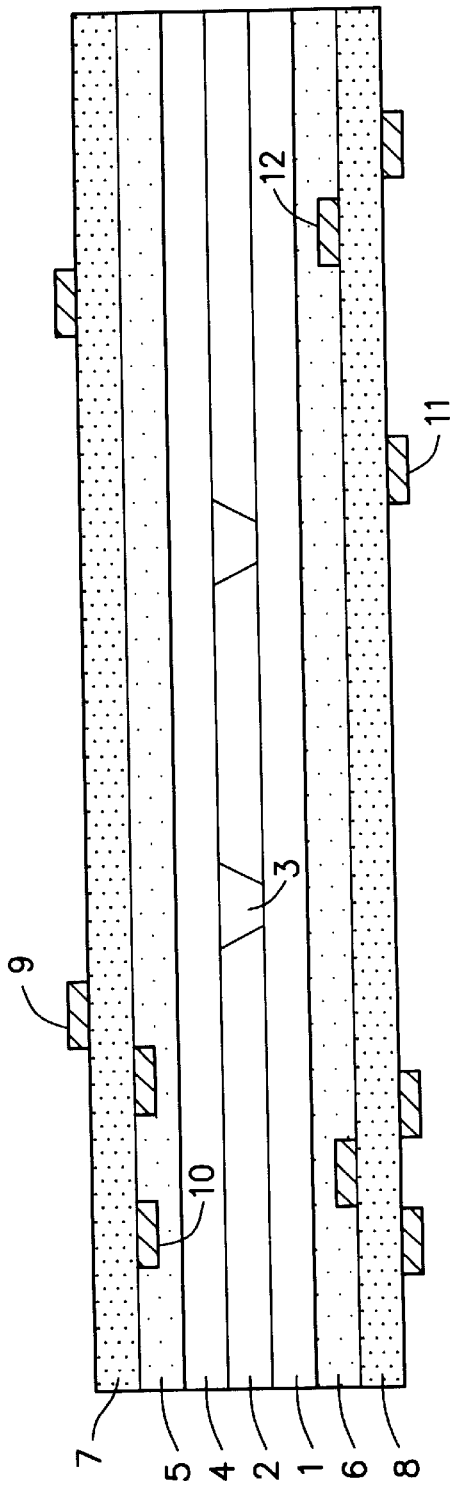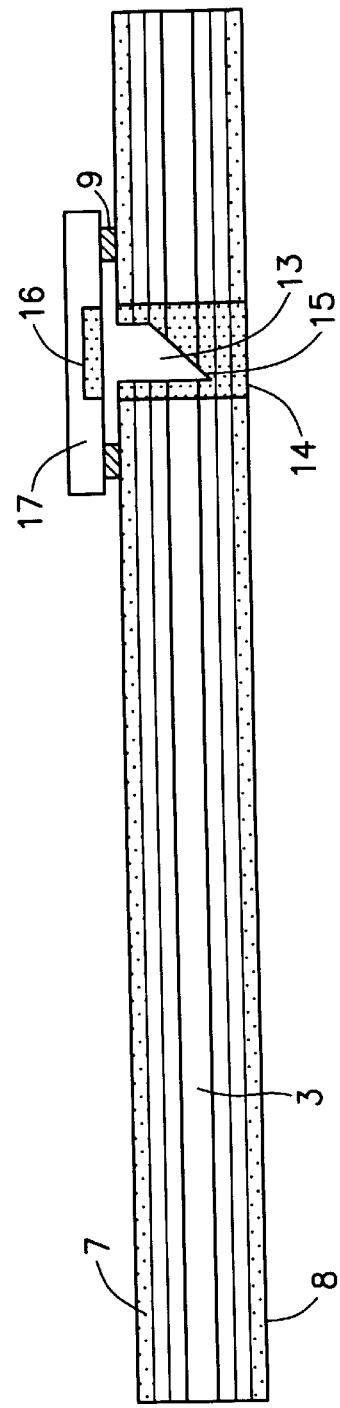

PRINTED CIRCUIT BOARD AND METHOD FOR ITS MANUFACTURE

FIELD OF THE INVENTION

The present invention relates to a printed circuit board and a method for its manufacture.

BACKGROUND INFORMATION

For information-technology and communication-technology devices, there exists an ever greater demand for signal-transmission paths which, having low susceptibility to failure and high data rates, permit data transmission that is reliable, fail-safe, and at the same time cost-effective. This development is essentially attributable to the dramatic increase in the capability of modem microelectronics for computer systems and their peripherals. In the field of mobile communication systems—e.g., for motor vehicles—there are also important demands such as savings in weight and ease of installation and service. This development is intensified by the introduction of interconnected systems for information and communication.

While optical signal transmission for longer distances has been introduced, its broad use in the application field of smaller, possibly mobile LANS (Local Area Networks), or even for signal transmission on the modular level, is prevented by the additional costs still to be borne at the present time for optical communications transmission engineering. However, because of the relatively small distances to be bridged (approximately 500 m maximum), the possibility offers itself of falling back on optical multimode waveguide systems for use in the short-wave spectral range (about 630–850 nm), since here it is possible to reduce costs because of the reduced geometrical tolerances and the less stringent demands on the attenuation deficiency of the materials. Inexpensive plastic fibers exist having sufficiently low attenuation, and suitable optoelectronic transmitter and receiver components are already commercially available or will soon be introduced into the marketplace. At the moment, various bus systems for broad-band signal transmission are standardized in the consumer electronics field, the real-time capability being of particular importance for high-quality transmission of audio-visual information. Optical data transmission via multimode fibers plays an important role here, whose importance will continue to grow in the future.

If various electronic devices, or even modules within a device, are to be operated in a system that is networked, for example, with plastic fibers, then further need arises for a cost-effective optical connection system. Passive optical components are necessary for the flexible configuration of networks of different topologies. Optical beam-shaping can be utilized to adapt the beam cross-sections, predefined by the optoelectronic components, to that of the multimode fibers, so that power losses can be kept to a minimum.

Since for the most part, electronic devices are constructed on the basis of printed circuit boards, the necessity results for implementing optical signal-transmission paths between individual modules of a printed circuit board or between different printed circuit boards, for implementing passive optical components such as power dividers, power combiners or star couplers, as well as for cost-effective methods for coupling optical fibers. Described in the following is a construction and a method for producing hybrid electrical/optical printed circuit boards which permit cost-effective implementation:

of optical multimode interconnect lines with passive structures;

of coupling points for optical fibers and for optoelectronic components for transmitting and receiving optical signals; and of conventional electrical signaling links on a shared carrier.

In modem printed circuit board technology, complex, multilayer, flexible or rigid layer systems are used as carriers which are suitable for fitting with surface-mounted devices (SMD). The selection of different base materials makes it possible to implement electrical signaling links having defined impedance and controlled signal propagation times. Typical, well-controlled structure measurements (widths and clearances of printed circuit traces) lie at approximately 40 $\mu$m. Epoxy-resin glass cloth (e.g., FR-4) is often used as substrate material for printed circuit boards. Multilayer printed circuit boards have been constructed from the most varied material combinations, e.g., from Teflon and FR-4 or Teflon and PMMI. The use of additional layers to compensate for different coefficients of thermal expansion is also known in principle.

Optical waveguide structures for single-mode and multi-mode operation have been implemented using many different methods in various material systems, among them also being plastic films. Among the numerous manufacturing methods, replicating methods are particularly cost-efficient if the necessary geometric structural fidelities lie in the range of a few micrometers, i.e., if multimode structures are intended to be used.

One possibility for producing waveguides is to pattern a core layer that has been applied on a substrate, using an embossing method in such a way that a pattern of depressions results corresponding to the desired waveguide arrangement, and to subsequently fill up these depressions with a further optically transparent material. This second material must have a higher refractive index compared to the substrate material, so that light can be conducted in the waveguide. An additional covering layer, having a lower refractive index compared to the waveguide core, is necessary so that the adjacent, non-transparent layers in the printed-board structure do not disturb the light propagation in the optical layer system. An example for a replicating method of producing optical multimode waveguide structures is described in the European Patent No. 0 480 618.

Another possibility for producing waveguides utilizes photolithographic processes. Usually a transparent substrate layer is first coated with a film of light-sensitive material. Chemical bonds in this material can be so altered by irradiation with short-wave light that either the component of the material exposed to light or the component not exposed to light becomes soluble by a solvent, and therefore can be removed in a further work step. For example, after the irradiation, it is thus possible to remove the material out of the provided waveguide cores, thus leaving behind the waveguide cores as a ribbed pattern on the substrate layer. This pattern is finally supplemented by a transparent covering layer to again obtain a level surface for the subsequent laminating steps. To permit optical waveguiding, the refractive index of the patterned waveguide cores must be greater than the indices of the adjacent layers.

The optical coupling of SMD-mounted optoelectronic components via reflecting facets to waveguide structures which have been implemented in additional polymer layers on the surface of printed circuit boards has been demonstrated (Thomsen, J. E., H. Levesque, E. Savov, F. Horwitz, B. L. Booth, J. E. Marchegiano, "Optical Waveguide Circuit Board with a Surface-Mounted Optical Receiver Array", Optical Engineering, vol. 33, no. 3, 989 (1994)).

SUMMARY OF THE INVENTION

The present invention described here lies in the expansion of the layer system of conventional printed circuit boards by an inner-lying system composed of at least one transparent layer in which an optical waveguide pattern is defined, for example, using molding methods or by a photolithographic arrangement. After the entire layer stack has been laminated, a compact structure results, similar to conventional printed circuit boards, having additional optical patterns in the interior.

The implementation of optical signaling links in one or more additional transparent inner layers of a printed circuit board using largely conventional techniques of the printed-circuit-board industry goes beyond the related art. The same holds true for the optical coupling of optoelectronic components to such inner layers by way of beam-deflecting facets.

The optoelectronic components can be coupled to inner-lying, optical, multimode waveguides by reflecting microprisms which, together with the components to be coupled, are placed in such a way when assembling the printed circuit board that their reflecting surfaces lie in openings provided for them (for example, produced by bore holes).

The present invention is preferably used for multilayer printed circuit boards whose layer structure includes a system of optically transparent materials having optical multimode strip waveguides.

BRIEF DESCRIPTION OF THE DRAWINGS

FIG. 1 is a representation of the layer structure of a hybrid electrical/optical printed circuit board.

FIG. 2 is a representation of the coupling of an optoelectronic component to a waveguide in an optical printed-circuit-board plane.

DETAILED DESCRIPTION

Figure 3:
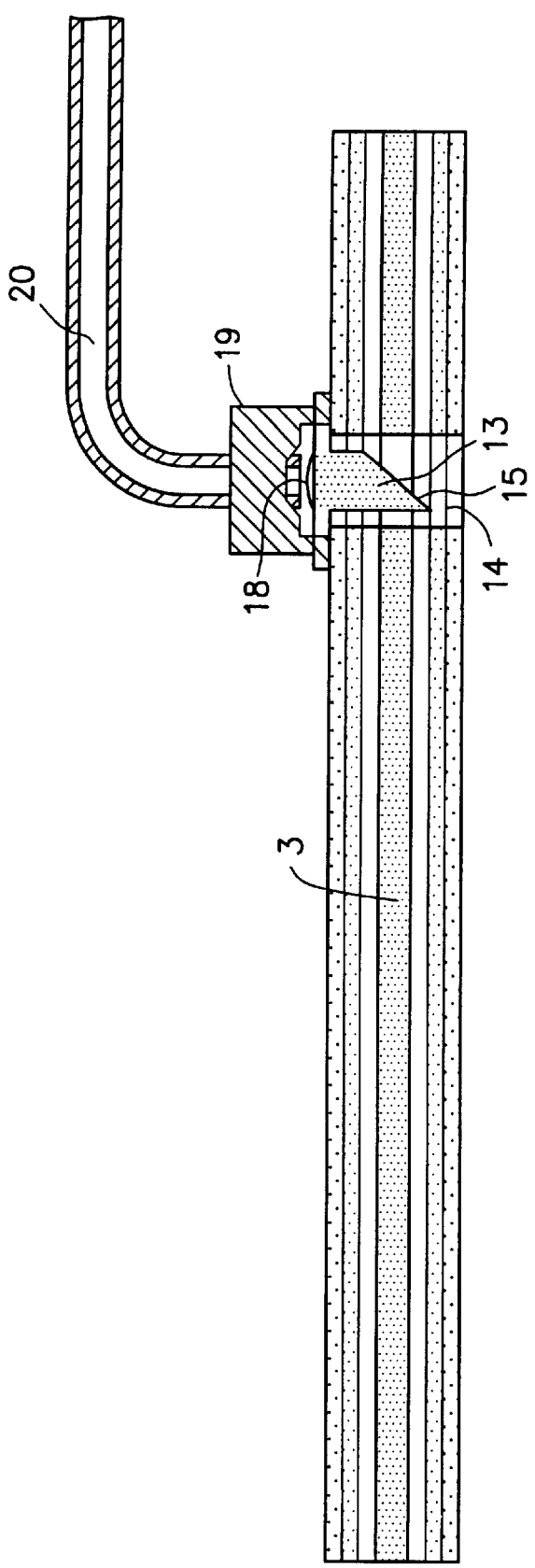
FIG. 3 is the coupling of an optical multimode fiber to an optical waveguide in the interior of an electrooptical printed circuit board.

The schematic sectional view of FIG. 1 shows a core layer 2 on a substrate layer 1, the core layer having two waveguide cores 3 which are covered by a covering layer 4. These three layers 1, 2, 4 are located between two thermomechanical adapter layers 5,6 which, for their part, are arranged between two electrical layers 7,8 to be fitted with components. These electrical component-fitted layers in each case have electrical printed circuit traces 9 through 12 on both sides. The exteriors of electrical component-fitted layers 7,8 having printed circuit traces 9,11 in each case form component-insertion planes for the fitting with electrical and/or electrooptical components.

Whether all four sides, or only one, two or three sides of the component-fitted layers are provided with printed circuit traces, is not essential for the present invention.

The integration of optical waveguide structures offers the advantage of implementing broad-band and (with respect to the emission and immission of electromagnetic radiation) noise-immune signaling links together with conventional electrical interconnects on a shared carrier. The employment of largely conventional patterning techniques permits the exploitation of cost advantages.

The advantage of arranging the optical layers in the interior of the printed circuit board is that the component-fitted layers remain largely uninfluenced, and further use of existing electrical circuit layouts is made possible. Furthermore, a symmetrical layer structure of the printed circuit board is achieved which has beneficial effects with respect to thermomechanical stability and reliability. For example, deflections in response to temperature changes, which would occur in the case of an asymmetrical layer structure due to different expansion coefficients, are avoided.

To produce electrical/optical printed circuit boards, first of all, optical waveguide structures are patterned in one or more layers of optically transparent material, it being possible to use various methods according to the related art for this purpose.

The system, pre-fabricated in this manner, composed of substrate (optionally on additional carrier material), waveguide cores and covering layer, is subsequently joined to the conventional component-fitted layers and additional layers for the thermomechanical adaptation to form a layer stack, and laminated. Since the laminating process is carried out at approximately 160 to 180° C., corresponding requirements must be directed to the thermal stability of the transparent materials utilized.

The use of conventional patterning techniques for producing optical multimode waveguides is essential for cost-effective production of optical signal-transmission paths in printed circuit boards. The pattern sizes of these waveguides (linear core dimensions approximately 40 $\mu$m and more) match well with the printed-circuit-trace pattern dimensions customary today. The usable methods include both photolithographic methods which utilize, for example, direct laser exposure, as well as embossing methods which are already used in the printed-circuit-board industry in the area of non-transparent plastics.

The geometry of an optical coupling point between an optoelectronic component, a reflecting facet and a waveguide is shown schematically in FIG. 2.

The layer structure is the same as in FIG. 1. One can imagine FIG. 2 as an intersection through FIG. 1 along a waveguide core 3. A microprism 13 penetrates from one side of the multilayer printed circuit board into the core layer, the microprism being arranged in an opening (bore hole) which is filled with an index-matched adhesive agent 14. At one end, microprism 13 has a reflecting (for example by metallization) facet 15 which forms an angle of 45° with the longitudinal axis of waveguide core 3 and with the bore-hole axis. Located at the other end of the microprism is the active surface 16 of an optoelectronic component 17, thus of an optoelectronic transducer, be it a radiation source or a radiation detector such as lasers or photodetectors. Optoelectronic component 17 is electrically contacted to printed circuit traces 9 on the exterior of electrical component-fitted layer 7.

To couple such optoelectronic components 17 (transmitter and receiver), which are mounted in a later assembly step, openings through the layer structure of the printed circuit board can thus be provided at locations designated for that purpose. These openings must completely include the waveguide core to permit coupling having as good an efficiency factor as possible. Pre-fabricated microprisms are glued in place in these openings in such a way that light is deflected from the waveguide plane by approximately 90° into the direction of the opening axis. Advantageously used for that purpose are metal-plated facet surfaces, inclined by approximately 45° toward the waveguide axis. After inserting the microprism, the remaining cavity of the opening, in particular of a bored hole, is expediently filled with a transparent adhesive. The refractive index of this adhesive can be selected such that optical reflections are minimized between the waveguide core and the prism body. In this way, the influence of the shape and roughness of the lateral surface of the bore hole on the optical coupling efficiency is minimized. In addition, air-filled cavities are avoided which would lead to difficulties during later processing steps such as soldering processes.

It is also possible to initially secure microprisms to the associated optoelectronic components (for instance, by cementing), after which the component, including the microprism, is mounted on the printed circuit board and contacted. The remaining cavity can be filled with optically transparent adhesive both before and after the placement of the microprisms, depending upon the requirements from a standpoint of production engineering.

FIG. 3 shows schematically the coupling of an optical multimode fiber to an optical waveguide in the interior of an electrooptical printed circuit board. At the location of the optoelectronic component (cf. FIG. 2) is a fiber accommodation 19 which mechanically fixes an optical fiber 20 in position, and is positioned relative to a lens 18. Lens 18 is preferably implemented by providing the microprism component with, for example, a dome shape on its outer-lying top side. Therefore, the lens is preferably manufactured as a component of the microprism in one operation (e.g., in the injection-molding method).

The optical function of the lens is to transform an incoming, divergent light bundle into an outgoing, converging light bundle, in order to attain the greatest possible coupling efficiency between the integrated waveguide and the optical fiber. This holds true both for the coupling of light from the fiber into the integrated waveguide and for the reverse direction, as well. Fiber accommodation 19 is secured, e.g. by cementing, on the component-fitted side of the printed circuit board.

Alternatively, it is also conceivable to provide the end of the fiber with a reflecting facet (45° bevel grind and metallization) and to cement it in place directly in the opening, in order to thus dispense with the separate microprism. However, the relatively costly fiber preparation, the problematic adjustment between the fiber and the integrated waveguide, as well as the difficulties of releasing such a coupling again in case of need, speaks against this procedure.

What is claimed is:

1. An optoelectronic printed circuit board formed as a laminated multilayer stack, comprising:
   at least one outer layer to be fitted with a plurality of components;
   at least one electrical printed circuit trace provided on an exterior of the at least one outer layer;
   a layer system including a plurality of additional, optically transparent layers and arranged with respect to the at least one outer layer; and
   at least one optical signal-transmission path patterned in an arbitrary layout and cross-section in the layer system as an integrated multimode strip waveguide, wherein the layer system is located in an interior of the multilayer stack;
   wherein:
      the at least one outer layer includes a first outer layer and a second outer layer,
      the at least one electrical printed circuit trace includes at least a first electrical printed circuit trace and a second electrical printed circuit trace,
      the first outer layer flanks a first side of the layer system and is provided with at least the first electrical printed circuit trace, and
      the second outer layer flanks a second side of the layer system and is provided with at least the second electrical printed circuit trace.

2. An optoelectronic printed circuit board formed as a laminated multilayer stack, comprising:
   at least one outer layer to be fitted with a plurality of components;
   at least one electrical printed circuit trace provided on an exterior of the at least one outer layer;
   a layer system including a plurality of additional, optically transparent layers and arranged with respect to the at least one outer layer;
   at least one optical signal-transmission path patterned in an arbitrary layout and cross-section in the layer system as an integrated multimode strip waveguide, wherein the layer system is located in an interior of the multilayer stack;
   an optical waveguide core provided in the layer system;
   an optoelectronic component;
   an optical fiber; and
   a microprism including a reflecting facet and provided in an opening extending through the at least one outer layer and at least a portion of the layer system in order to optically couple one of the optoelectronic component and the optical fiber to the multimode waveguide, wherein:
      the reflecting facet of the microprism is located in a plane of the optical waveguide core, and
      the microprism is secured in the opening using an adhesive agent matched to a refractive index such that a light bundle is deflected according to one of a path from a waveguide axis into an axis of the opening and a path from the axis of the opening to the waveguide axis.

3. The printed circuit board according to claim 2, wherein the adhesive agent occupies a gap between the microprism and a lateral surface of the opening in an area of the optical waveguide core.

4. A method for producing an optoelectronic printed circuit board formed as a laminated multilayer stack, comprising the steps of:
   providing at least one outer component-fitted layer;
   providing at least one electrical printed circuit trace on an exterior of the at least one outer component-fitted layer;
   providing a layer system that includes a plurality of additional, optically transparent layers located in an interior of the multilayer stack;
   patterning an optical signal-transmission path as an integrated multimode strip waveguide to define an optical waveguide core in the layer system;
   providing an optoelectronic component;
   providing an optical fiber;
   providing a microprism including a reflecting facet in an opening extending through the at least one outer component-fitted layer and at least a portion of the layer system to optically couple one of the optoelectronic component and the optical fiber to the multimode waveguide;
   locating the reflecting facet of the microprism in a plane of the optical waveguide core; and
   securing the microprism in the opening using an adhesive agent matched to a refractive index such that a light bundle is deflected according to one of a path from a waveguide axis into an axis of the opening and a path from the axis of the opening to the waveguide axis, the step of securing the microprism including the steps of:
    securing the microprism in the opening, and
    after the microprism is secured in the opening, subsequently adjusting the optoelectronic component relative to the microprism and mounting the optoelectronic component on the microprism.

5. A method for producing an optoelectronic printed circuit board formed as a laminated multilayer stack, comprising the steps of:

providing at least one outer component-fitted layer;

providing at least one electrical printed circuit trace on an exterior of the at least one outer component-fitted layer, providing a layer system that includes a plurality of additional, optically transparent layers located in an interior of the multilayer stack;

patterning an optical signal-transmission path an integrated multimode strip waveguide to define an optical waveguide core in the layer system;

providing an optoelectronic component;

providing an optical fiber;

providing a microprism including a reflecting facet in an opening extending through the at least one outer component-fitted layer and at least a portion of the layer system to optically couple one of the optoelectronic component and the optical fiber to the multimode waveguide;

locating the reflecting facet of the microprism in a plane of the optical waveguide core; and securing the microprism in the opening using an adhesive agent matched to a refractive index such that a light bundle is deflected according to one of a path from a waveguide axis into an axis of the opening and a path from the axis of the opening to the waveguide axis, the step of securing the microprism including the steps of:
    securing the microprism to the optoelectronic component, and
    adjusting and securing both the microprism and the optoelectronic component in the opening.

* * * * *